United States Patent
Haerle et al.

(10) Patent No.: US 9,410,063 B2
(45) Date of Patent: Aug. 9, 2016

(54) POLISHING SLURRY INCLUDING ZIRCONIA PARTICLES AND A METHOD OF USING THE POLISHING SLURRY

(71) Applicant: Saint-Gobain Ceramics & Plastics, Inc., Worcester, MA (US)

(72) Inventors: Andrew G. Haerle, Sutton, MA (US); Jun Wang, Shrewsbury, MA (US); Frederic Wiss, Caumont sur Durance (FR)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 0 days.

(21) Appl. No.: 14/800,188

(22) Filed: Jul. 15, 2015

(65) Prior Publication Data
US 2015/0315441 A1   Nov. 5, 2015

Related U.S. Application Data

(63) Continuation of application No. 13/338,753, filed on Dec. 28, 2011, now Pat. No. 9,120,200.

(60) Provisional application No. 61/427,747, filed on Dec. 28, 2010.

(51) Int. Cl.
C09G 1/02 (2006.01)
H01L 21/304 (2006.01)
(Continued)

(52) U.S. Cl.
CPC .............. *C09K 3/1409* (2013.01); *B24B 37/044* (2013.01); *C01G 25/02* (2013.01);
(Continued)

(58) Field of Classification Search
CPC ....... H01L 21/304; H01L 21/306; B24B 1/00; B24B 7/00; B24B 7/04; B24B 37/042; B24B 37/044; C09G 1/02; C09G 1/04; C01G 25/02; C01P 2006/22
USPC .............. 451/36, 41, 285, 287; 438/692, 693; 156/345.12; 257/E21.237, E21.304; 252/79.1, 79.2
See application file for complete search history.

(56) References Cited

U.S. PATENT DOCUMENTS 4,065,544 A * 12/1977 Hamling .............. B01J 37/0018
                                                            252/625
5,525,191 A   6/1996 Maniar et al.
(Continued)

FOREIGN PATENT DOCUMENTS

CN   1457506 A1   11/2003
JP   H05193947 A   8/1993
(Continued)

OTHER PUBLICATIONS

Horiba, Particle Size Distribution Analyzer, AN134, Zirconium Oxide, 2004, 2 pgs.
(Continued)

*Primary Examiner* — Eileen Morgan
(74) *Attorney, Agent, or Firm* — Abel Law Group, LLP; Adam Keser

(57) ABSTRACT

A polishing slurry can include zirconia particles. The polishing slurry can be used to polish conductive and insulating materials, and is particularly well suited for polishing oxide materials as well as metals. The characteristics of the zirconia particles can affect the polishing of workpieces. By selecting the proper characteristics, the polishing slurry can have a good material removal rate while still providing an acceptable surface finish. The zirconia particles can be used as a replacement for, or in conjunction with, ceria or other abrasive particles. The content of zirconia particles in the polishing slurry may be less than a comparable polishing slurry having silica or alumina particles.

11 Claims, 5 Drawing Sheets

(51) Int. Cl.
*C09K 3/14* (2006.01)
*B24B 37/04* (2012.01)
*C01G 25/02* (2006.01)

(52) U.S. Cl.
CPC .............. *C09G 1/02* (2013.01); *H01L 21/304* (2013.01); *C01P 2002/52* (2013.01); *C01P 2002/76* (2013.01); *C01P 2004/50* (2013.01); *C01P 2004/51* (2013.01); *C01P 2004/62* (2013.01); *C01P 2004/64* (2013.01); *C01P 2006/10* (2013.01); *C01P 2006/12* (2013.01); *C01P 2006/16* (2013.01); *C01P 2006/22* (2013.01); *C01P 2006/40* (2013.01); *Y10T 428/2982* (2015.01)

(56) References Cited

U.S. PATENT DOCUMENTS

| | | |
|---|---|---|
| 5,759,917 A | 6/1998 | Grover et al. |
| 5,935,871 A * | 8/1999 | Farkas ............... H01L 21/02074 134/2 |
| 5,954,997 A | 9/1999 | Kaufman et al. |
| 6,174,454 B1 | 1/2001 | Tsai et al. |
| 6,343,976 B1 | 2/2002 | Yoshida et al. |
| 6,364,919 B1 | 4/2002 | Lee et al. |
| 6,428,721 B1 | 8/2002 | Ina et al. |
| 6,451,696 B1 * | 9/2002 | Hara ................. H01L 21/02032 257/E21.215 |
| 6,551,367 B2 | 4/2003 | Lee et al. |
| 6,786,945 B2 * | 9/2004 | Machii ..................... C09G 1/02 106/3 |
| 6,863,700 B2 | 3/2005 | Yoshida et al. |
| 7,115,021 B2 | 10/2006 | Yoshida et al. |
| 7,153,197 B2 | 12/2006 | Shih et al. |
| 7,452,481 B2 | 11/2008 | Suzuki et al. |
| 7,790,618 B2 | 9/2010 | Bian |
| 9,120,200 B2 * | 9/2015 | Haerle ................. B24B 37/044 |
| 2001/0013507 A1 | 8/2001 | Hosali et al. |
| 2001/0034979 A1 | 11/2001 | Lee et al. |
| 2002/0004302 A1 * | 1/2002 | Fukumoto ........ G02F 1/133553 438/689 |
| 2003/0013387 A1 * | 1/2003 | Tsai .................. B24B 37/0056 451/41 |
| 2004/0065022 A1 * | 4/2004 | Machii ..................... C09G 1/02 51/309 |
| 2005/0056537 A1 * | 3/2005 | Chen ....................... B23H 5/08 204/229.4 |
| 2005/0109980 A1 | 5/2005 | Wang |
| 2006/0199473 A1 * | 9/2006 | Suzuki ................... B24B 37/24 451/8 |
| 2006/0255314 A1 | 11/2006 | Suzuki et al. |
| 2009/0029482 A1 * | 1/2009 | Usuki .............. G01N 33/54313 436/531 |
| 2009/0090696 A1 | 4/2009 | White et al. |
| 2009/0105354 A1 * | 4/2009 | Oswald ................. B82Y 30/00 516/98 |

FOREIGN PATENT DOCUMENTS

| | | |
|---|---|---|
| JP | 2001070825 A | 3/2001 |
| JP | 2006324639 A | 11/2006 |
| KR | 20000017512 A | 3/2000 |
| KR | 10-2002-0086953 A | 11/2002 |
| KR | 20040016154 A | 2/2004 |
| TW | 416104 | 12/2000 |
| WO | 0017282 A | 3/2000 |
| WO | 02/067309 A1 | 8/2002 |
| WO | 2012092361 A2 | 7/2012 |

OTHER PUBLICATIONS

Sung-Woo Park, et al., "A study on the chemical mechanical polishing of oxide film using a zirconia (ZrO2)-mixed abrasive slurry (MAS)," Science Direct, Jan. 2008, pp. 682-688.
Y.-L. Wang, et at., "Chemical-mechanical polishing of low-dielectric-constant spin-on-glasses: film chemistries, slurry formulation and polish selectivity," Thin Solid Films, 1997, pp. 550-.
L.M. Cook, "Chemical processes in glass polishing," J. Non-Crystal. Solids. 120, 1-3, 152-171, 1990.
M. Krishnan, et al., "Chemical mechanical planarization: slurry chemistry, materials, and mechanisms," Chem. Rev. 110, 178-204, 2010.
B. Jachimska, et al., "Characterization of rheological properties of colloidal zirconia," ScienceDirect, Journal of the European Ceramic Society 27 (2007) pp. 2209-2215.
International Search Report for PCT/US2011/067565, mailed Nov. 30, 2012, 2 pages.
Tan, Qiangqiang et al., "Rheological Properties of Nanometer Tetragonal Polycrystal Zirconia Slurries for Aqueous Gel Tape Casting Process," Mater Lett, May 2003, vol. 57, No. 16-17, pp. 2375-2381.
Wei, Wen-Cheng J. et al., "Electrokinetic Properties of Colloidal Zirconia Powders in Aqueous Suspension," J. Am. Ceram. Soc., Dec. 1999, vol. 82, No. 12, pp. 3385-3392.
Supplementary European Search Report, Dated Aug. 20, 2015, App. No. EP 11853515, 1 page.
Abraham I et al: "Powder Preperation, Mechanical and Electrical Properties of Cubic Zirconia Ceramics", Journal of the European Ceramic Society, Elsevier Science Publishers, Barking, Essex, GB, vol. 16, No. 1, Jan. 1996, pp. 71-77.

* cited by examiner

POLISHING SLURRY INCLUDING ZIRCONIA PARTICLES AND A METHOD OF USING THE POLISHING SLURRY

CROSS-REFERENCE TO RELATED APPLICATION(S)

The present application is a continuation of U.S. Non-Provisional patent application Ser. No. 13/338,753, filed Dec. 28, 2011, entitled "POLISHING SLURRY INCLUDING ZIRCONIA PARTICLES AND A METHOD OF USING THE POLISHING SLURRY," naming inventors Andrew G. Haerle, Jun Wang, and Frederic Wiss, and claims priority from U.S. Provisional Patent Application No. 61/427,747, filed Dec. 28, 2010, entitled "POLISHING SLURRY INCLUDING ZIRCONIA PARTICLES AND A METHOD OF USING THE POLISHING SLURRY," naming inventors Andrew G. Haerle, Jun Wang, and Frederic Wiss, which application is incorporated by reference herein in its entirety.

FIELD OF THE DISCLOSURE

The present disclosure is directed to polishing slurries including zirconia particles and methods of using the polishing slurries.

BACKGROUND

Polishing is used widely within the microelectronics industry. Smaller feature sizes are requiring workpieces to be planarized to allow lithographic operations to be performed properly. In another application, some metals, such as copper, are not readily removed by dry etching techniques. An inlaid process sequence can be performed wherein a metal layer is deposited over a patterned insulating layer and within openings of the patterned insulating layer. Polishing can be used to remove the metal lying outside openings of the patterned layer, leaving an inlaid metal pattern corresponding to contacts, vias, or interconnects.

Within the microelectronics industry, polishing is performed as chemical-mechanical polishing, also known as chemical-chemical mechanical planarization, which involves a chemical reacting or interaction between an exposed surface of the workpiece and a component of a polishing slurry to form a polishing product. Abrasive particles within the polishing slurry remove the polishing product to expose an underlying portion of workpiece. The polishing continues until a substantially planar surface is achieved, a sufficient amount of a layer is removed, another criterion is met, or any combination thereof. The development of chemical-mechanical polishing slurries can be challenging because of potential adverse interactions between the components within the slurry, the layer being polished during polishing, a different layer that may become exposed during polishing, or any combination thereof.

BRIEF DESCRIPTION OF THE DRAWINGS

Embodiments are illustrated by way of example and are not limited in the accompanying figures.

DETAILED DESCRIPTION

Figure 1:
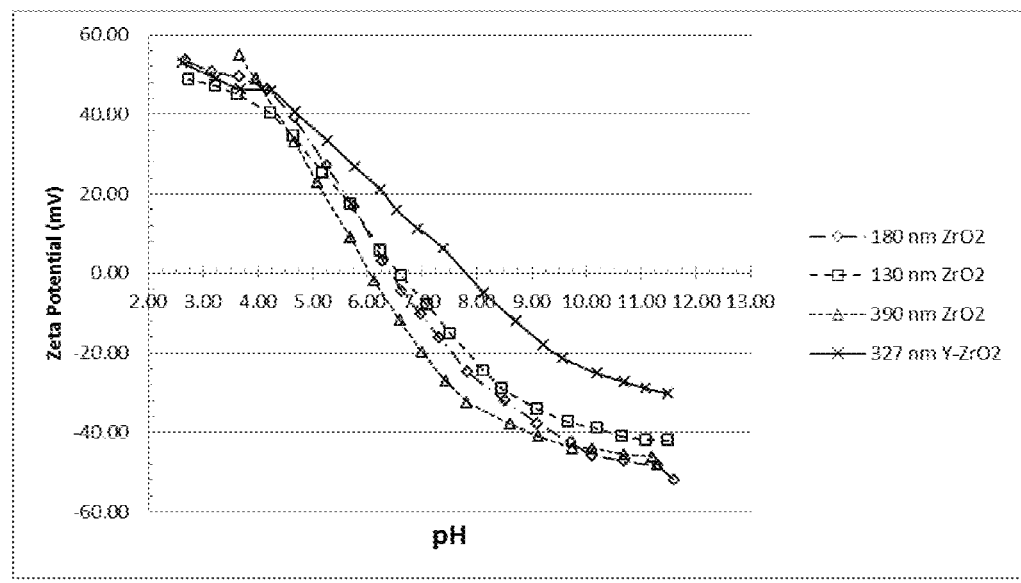
FIG. 1 includes a graph of zeta potential as a function of pH for different sizes of zirconia particles and yttria stabilized zirconia particles in accordance with embodiments of the present invention.

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the term "$10^{th}$ percentile particle size" is intended to mean that, at a particular size, 10% of the particles have such particular size and larger. The term "$90^{th}$ percentile particle size" is intended to mean that, at a particular size, 90% of the particles have such particular size and larger.

The term "averaged" is intended to mean an average, a median, or a geometric mean. Thus, an average value, a median value, and a geometric mean value are specific types of an averaged value.

The term "rare earth element" is intended to mean Sc, Y, or any of the Lanthanides (La to Lu) in the Periodic Table of the Elements.

The term "stable zeta potential" is intended to mean that, over a two-unit range of pH of a slurry, the maximum range in zeta potential is no greater than 10 mV, and the term "very stable zeta potential" is intended to mean that, over a four-unit range of pH, the maximum range in zeta potential of a slurry is no greater than 10 mV.

Group numbers corresponding to columns within the Periodic Table of the Elements use the "New Notation" convention as seen in the CRC Handbook of Chemistry and Physics, $81^{st}$ Edition (2000-2001).

The terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the chemical-mechanical polishing and planarization ("CMP") arts.

A polishing slurry can include zirconia particles. The zirconia particles can be the only abrasive particles or used in conjunction with abrasive particles having other compositions. The zirconia particles allow particularly useful polishing characteristics to be achieved, particularly when performing a CMP operation. In a particular embodiment, the zirconia particles can be used in a polishing slurry tailored for polishing an insulating material, such as an oxide, or another polishing slurry tailored for polishing a conductive material, such as a metal-containing material.

Further, the zirconia particles can be characterized as having a chemical activity or an electronic activity at a surface of a material for which the polishing slurry is adapted to polish. In an embodiment, zirconia particles may react with the material being polished or may react with a component of the slurry to form a reaction product that can further react with the material being polished. In another embodiment, the zirconia particles may transfer (donate or accept) electrons with the material being polished. In still another embodiment, the zirconia particles may transfer electrons with a component within the polishing slurry. After the electron transfer occurs with the material or the component within the slurry, the material may be more readily polished. Thus, the zirconia particles may not be merely an inert material that would be used solely for its mechanical properties.

The zirconia particles can include an additive, also called a dopant, that affects a crystalline structure of the zirconia particles or significantly affects a polishing characteristic of the polishing slurry. The additive can be a rare earth element, a Group 2 element, a Group 8 element, a Group 9 element, a Group 13 element, a Group 15 element, a Group 16 element other than oxygen, a Group 17 element, or a noble metal (that is, Ru, Rh, Pd, Ag, Os, Ir, Pt, or Au). More than one additive may be used.

Figure 8:
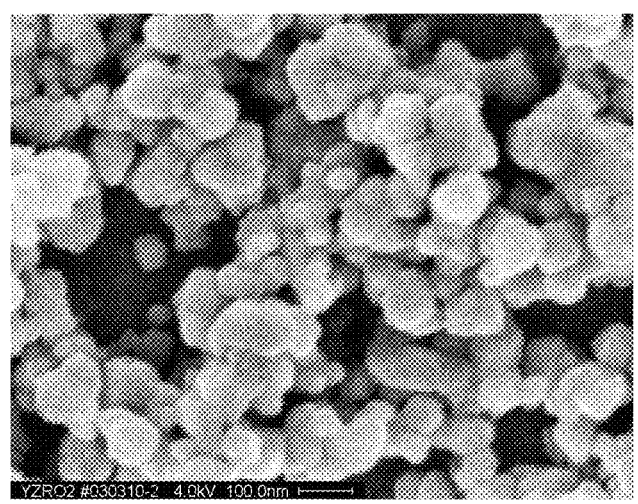
FIG. 8 includes an SEM image of a slurry of Yttrium doped zirconia particles in accordance with embodiments of the present invention Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

Crystalline structures of zirconia include monoclinic, tetragonal, or cubic. Substantially pure zirconia is monoclinic up to a temperature of approximately 1000° C., tetragonal at a temperature in a range of approximately 1000° C. to approximately 2370° C., and cubic at higher temperatures. An additive can be added to stabilize zirconia so that it can retain a tetragonal or cubic crystal structure at room temperature, as opposed to the monoclinic crystalline structure. In an embodiment, a significant amount of tetragonal $ZrO_2$, cubic $ZrO_2$, or both crystalline forms can be used in a polishing slurry for polishing and may include benefits over using monoclinic $ZrO_2$. In a particular embodiment, a majority or substantially all of the zirconia particles can be tetragonal $ZrO_2$, and in another particular embodiment, a majority or substantially all of the zirconia particles can be cubic $ZrO_2$. The zirconia may be partially stabilized or completely stabilized. A rare earth element, a Group 2 element, or any combination thereof can be used to stabilize the zirconia. In an embodiment, Y, Ce, or Ca may be used to form stabilized zirconia that retains its tetragonal or cubic crystalline structure. In a particular embodiment, Ce may be useful, because ceria, when used in an abrasive CMP slurry for oxide polishing, metal polishing, alloy polishing, or combinations thereof, has good polishing characteristics. In another particular embodiment, Y may be useful, because yttria, when used in an abrasive CMP slurry for oxide polishing, metal polishing, alloy polishing, or combinations thereof has good polishing characteristics. FIG. 8 shows an embodiment of slurry including yttrium doped zirconia particles having a stabilized tetragonal crystal form.

In another embodiment, a different additive, also called a dopant, may be used for another reason. For example, the additive may help to locally affect conditions near the surface being polished. A chemical reaction or interaction at the surface of the layer being polished may be catalyzed or otherwise affected by the presence of an additive within the zirconia particles. For example, if the additive is in a different oxidation state as compared to $Zr^{+4}$, the additive may affect the local charge of the particles. For example, an additive having a +1, +2, or +3 oxidation state may help to attract electrons, and an additive having a +5, +6, or +7 oxidation state may help to provide electrons. Many different elements may be used. In an embodiment, the additive can include a Group 2 element, a Group 8 element, a Group 9 element, a Group 13 element, a Group 15 element, a Group 16 element other than oxygen, a Group 17 element. Another additive may help to catalyze a desired reaction or inhibit an undesired reaction. For example, a noble metal may help to catalyze a reaction between the material of the layer being polished and a component within the polishing slurry. In a particular embodiment, Pt, Pd, Rh, or any combination thereof may be used.

The amount of any particular additive or combination of additives in the zirconia particles can have a significant impact on the zirconia particles, the polishing characteristics, or any combination thereof. In an embodiment, the amount of the additive in the zirconia particles is less than an amount that would form a separate phase within the zirconia particles. In an embodiment, the concentration of the additive is at least approximately 0.002 mol %, at least approximately 0.02 mol %, or at least approximately 0.2 mol %. In another embodiment, the concentration of the additive is no greater than approximately 9 mol %, no greater than approximately 7 mol %, or no greater than 5 mol %. In a particular embodiment, the concentration of the additive is in a range of approximately 1 mol % to approximately 5 mol %, about 1.5 mol % to approximately 4.5 mol %, or about 2 mol % to approximately 4 mol %. The amount of additive within the zirconia particles added may depend on the particular element being added, and thus, the numerical values are to illustrate potential concentrations, and not to limit the scope of the present invention.

Turning to methods of making the zirconia particles, in an embodiment, the zirconia particles can be formed through a precipitation and calcination process. For example, a base may be added to a solution including a zirconium salt or a zirconium salt may be added to a solution including a base. In particular, the solution may be an aqueous solution of zirconium salt. An example of a zirconium salt includes zirconium nitrate, zirconium chloride, zirconium hydroxide, zirconium sulfate, or combinations thereof. In a particular embodiment, the zirconium salt includes a zirconium sulfate.

While various bases may be used, processing typically involves mixing a metal hydroxide base with the aqueous solution of the zirconium salt. The metal hydroxide base may be a base formed from an alkali metal or a base formed from an alkali earth metal. In particular, an example of a metal hydroxide base includes potassium hydroxide (KOH), sodium hydroxide (NaOH), or a combination thereof. In a particular embodiment, sodium hydroxide is mixed with the aqueous solution of zirconium sulfate.

Prior to precipitation, an additive can be added to the solution in the form of a salt. In an embodiment, a salt of Y or Ce is added to the mixture prior to precipitation to form a stabilized zirconia.

After precipitation, the mixture can be dried to obtain an amorphous zirconia particulate material in the form of a powder. For example, the mixture can be dried using, for example, a spray drying, freeze drying, or pan drying process. In general, differing agglomeration characteristics may be achieved by the selected drying processes.

As mentioned above, the dried zirconium oxide particulate can be thermally treated to obtain different crystal forms, for example, by using a calcining process at a temperature sufficient to promote crystal growth and to increase density in the particulate zirconia material. In an embodiment, the zirconia is heated up to a temperature of approximately 1000° C. to obtain a monoclinic crystal structure. In another embodiment, tetragonal crystal is obtained by heating at a temperature in a range of approximately 1000° C. to approximately 2370° C. In another embodiment, cubic form is obtained at higher temperatures. Unless an additive has been added to stabilize the zirconia, so that it can retain a tetragonal or cubic crystal structure, the zirconia will revert to monoclinic form as it cools down below 1000° C. In an embodiment, an aggregated mass of polycrystalline zirconia is obtained by thermal treatment of zirconia particles. In an embodiment, the polycrystalline zirconia particles are monoclinic. In another embodiment, the polycrystalline zirconia particles are tetragonal. In another embodiment, the polycrystalline zirconia particles are cubic. In another embodiment, the polycrystalline zirconia particles are a mixture of monoclinic and tetragonal. In another embodiment, the polycrystalline zirconia particles are a mixture of tetragonal and cubic.

It will be generally understood that after a thermal treatment process, such as calcination, the obtained agglomerates, which are secondary particles having a secondary particle size, are composed of individual crystallites, also called grains, which are primary particles having a primary particle size. The primary particles are strongly bonded together through necking and intragranular grain growth in the form of a porous agglomerate mass, which is the secondary particle. Unless otherwise stated, all references to the particle size, or particles size distribution, of zirconia particles are to the secondary particle size.

In an embodiment, the aggregated mass of calcined zirconia material is wet-milled to obtain a desired secondary particle size distribution. In an embodiment, the zirconia is de-aggregated in an attrition mill containing yttria stabilized zirconia. The milling time and conditions are determined by the intended secondary particle size distribution.

In an alternate production method, zirconia particles are formed by introducing zircon sand into an arc furnace, wherein it is dissociated to form a fused zirconia aggregate powder. The fused crystals obtained can be reduced in size in an attrition mill as described previously to obtain a desired secondary particle size distribution.

The size of the zirconia particles can affect the polishing characteristics. If the zirconia particles are too small, the polishing rate may be too low, and if the zirconia particles are too large, the polishing rate may be high, but the polished surface may have scratches or another surface defect. The particle size can be characterized by an averaged particle size, a $10^{th}$ percentile particle size, a $90^{th}$ percentile particle size, or any combination thereof. For nominal particle sizes less than 100 nm, the particle sizes can be determined with 0.1 wt % zirconia particles in water with $HNO_3$ or KOH to achieve pHs of 5 and 10 and using a Zetasizer Nano-ZS™-brand analytical tool from Malvern Instruments, Ltd. For nominal particle sizes greater than 100 nm, the particle sizes can be determined by placing a few drops of a zirconia solution (approximately 5 to 10 wt % zirconia particles in water) into a 0.3 wt % sodium hexametaphosphate aqueous solution using a LA-920™-brand particle size distribution analyzer from Horiba, Ltd. The particle size determination is made when a lamp intensity of the analyzer reaches approximately 70% to approximately 75%.

Figure 7:
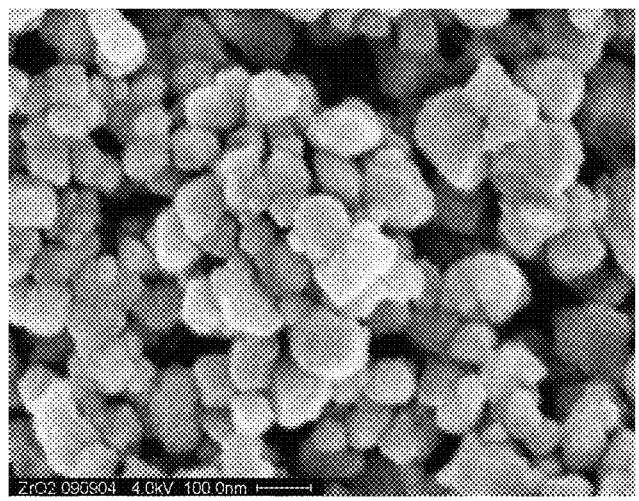
FIG. 7 includes an SEM image of a slurry of zirconia particles (180 nm) in accordance with embodiments of the present invention.

In an embodiment, the averaged particle size is at least approximately 50 nm, at least approximately 80 nm, at least approximately 110 nm, or at least approximately 130 nm. In another embodiment, the averaged particle size is no greater than approximately 800 nm, no greater than approximately 770 nm, no greater than approximately 600 nm, no greater than approximately 555 nm, no greater than approximately 400 nm, no greater than approximately 380 nm, no greater than approximately 350 nm, no greater than approximately 330 nm, no greater than approximately 300 nm, no greater than approximately 250 nm, or no greater than approximately 200 nm. In another embodiment, the averaged particle size is in a range of approximately 130 nm to 350 nm. In a particular embodiment, the averaged particle size is approximately 330 nm. In another embodiment, the average particle size is in a range of approximately 130 nm to approximately 200 nm. In another embodiment, the averaged particle size is approximately 150 nm to 350 nm. In a particular embodiment, the averaged particle size is approximately 180 nm. In a particular embodiment, any of the averaged particle sizes can be a median particle size. In an embodiment, the $10^{th}$ percentile particle size is at least approximately 51 nm, at least approximately 65 nm, or at least approximately 80 nm. In another embodiment, the $10^{th}$ percentile particle size is no greater than approximately 450 nm, no greater than approximately 350 nm, no greater than 250, no greater than approximately 200 nm, or no greater than approximately 170 nm. In a particular embodiment, the $10^{th}$ percentile particle size is in a range of approximately 80 nm to approximately 130 nm. In another particular embodiment, the $10^{th}$ percentile particle size is in a range of approximately 150 nm to approximately 200 nm. In an embodiment, the $90^{th}$ percentile particle size is at least approximately 50 nm, at least approximately 100 nm, or at least approximately 200 nm. In another embodiment, the $90^{th}$ percentile particle size is no greater than approximately 1600 nm, no greater than approximately 1200 nm, no greater than approximately 800 nm, no greater than approximately 700 nm, or no greater than approximately 300 nm. In a particular embodiment, the $90^{th}$ percentile particle size is in a range of approximately 200 nm to approximately 300 nm. In another particular embodiment, the $90^{th}$ percentile particle size is in a range of approximately 600 nm to approximately 720 nm. FIG. 7 shows an embodiment of slurry including zirconia particles having an averaged particle size of 180 nm.

The shapes of the zirconia particles can be random. Many of the zirconia particles can be characterized as being substantially spherical, substantially platelet-shaped, or polyhedral. In a particular embodiment, zirconia particles may be separated by shape. Therefore, a majority or substantially all of the zirconia particles can be substantially spherical, a majority or substantially all of the zirconia particles can be substantially platelet-shaped, or a majority or substantially all of the zirconia particles can be substantially polyhedral.

The zirconia particles may be also be characterized by specific surface area ("SSA"). In an embodiment, the SSA is at least approximately 5 $m^2/g$, at least approximately 6 $m^2/g$, at least approximately 7 $m^2/g$, at least approximately 8 $m^2/g$, at least approximately 9 $m^2/g$, or at least approximately 10 $m^2/g$. In another embodiment, the SSA is no greater than approximately 55 $m^2/g$, no greater than approximately 45 $m^2/g$, no greater than approximately 35 $m^2/g$, or no greater than approximately 25 $m^2/g$. In a particular embodiment, the SSA is in a range of approximately 11 $m^2/g$ to approximately 25 $m^2/g$. In another particular embodiment, the SSA is in a range of approximately 11 $m^2/g$ to approximately 17 $m^2/g$. In another particular embodiment, the SSA is in a range of approximately 19 $m^2/g$ to approximately 25 $m^2/g$.

The zirconia particles can have a density that varies based in part on the particle size. The zirconia particles having a nominal particle size of 50 nm and smaller can form a colloidal solution, and the zirconia particles having a nominal size of 130 nm and larger do not form a colloidal solution. In an embodiment, the density is at least approximately 3.20 $g/m^3$, at least approximately 4.00 $g/m^3$, at least approximately 5.00 $g/m^3$, or at least approximately 5.25 $g/m^3$. In another embodiment, the density is no greater than approximately 5.80 $g/m^3$, no greater than approximately 5.78 $g/m^3$, or no greater than approximately 5.76 $g/m^3$. In a particular embodiment, the density is in a range of approximately 5.50 $g/m^3$ to approximately 5.75 $g/m^3$. In another particular embodiment, the density is in a range of approximately 5.50 $g/m^3$ to approximately 5.65 $g/m^3$. In another particular embodiment, the density is in a range of approximately 5.66 $g/m^3$ to approximately 5.75 $g/m^3$.

The zirconia particles may also be characterized by an averaged pore size. The pore size can be measured by a TriStar 3000™-brand surface area analyzer by Micromeritics Instrument Corporation based on the Barrett-Joyner-Halenda ("BJH") method. $N_2$ gas can be used as the adsorbate. In an embodiment, the averaged pore size is at least approximately 1 nm, at least approximately 5 nm, or at least approximately 11 nm. In another embodiment, the averaged pore size is no greater than approximately 30 nm, no greater than approximately 29 nm, or no greater than approximately 28 nm. In a particular embodiment, the averaged pore size is in a range of approximately 15 nm to approximately 26 nm. In another particular embodiment, the averaged pore size is in a range of approximately 15 nm to approximately 20 nm. In another particular embodiment, the averaged pore size is in a range of approximately 15 nm to approximately 26 nm.

The stability of a zeta potential of the zirconia particles can be a significant factor for a polishing slurry in CMP. The zeta potential can affect whether a polishing product is attracted to or repelled by an abrasive particle, and how strong such attraction or repulsion is. While the polishing slurry has a bulk pH value, the local pH may vary based on the material being polished or a material that becomes exposed during polishing. A polishing slurry may have a more predictable behavior if the zeta potential of the zirconia particles does not significantly vary over a wider pH range.

FIG. 1 includes a graph of zeta potentials for different zirconia particle sizes, including a stabilized zirconia, as a function of pH. Note that the plots are different for each of the particle sizes. The zeta potential data for each of the different sizes of zirconia particles was obtained using a slurry that only included water, approximately 0.01 wt % zirconia or stabilized zirconia particles for each of the particular sizes, and, if needed, KCl solution to control background ionic strength, and an acid (for example, $HNO_3$) or a base (for example, KOH) to adjust pH. The slurry did not include a surfactant or any other additive. In a particular embodiment, autotitration was performed using a Malvern MPT-autotitrator attached to a Malvern Zetasizer. Three titrants, 0.25M KOH, 0.025M HNO3, and 0.25M HNO3 were used. To control background ionic strength, 0.001M KCl solution was used. Titration was done from high pH (12.0) to low pH (2.0) by increments of approximately 0.5 pH units. At each pH, at least two Zeta potential measurements were collected. The average of the zeta potential measurements at each pH was graphed as shown in FIG. 1.

TABLE 1

130 nm Nominal Particle Size Zirconia

| pH | Avg. Zeta (mV) |
|---|---|
| 11.50 | −42.10 |
| 11.10 | −41.95 |
| 10.65 | −41.05 |
| 10.20 | −39.00 |
| 9.67 | −37.35 |
| 9.10 | −34.20 |
| 8.47 | −29.10 |
| 8.13 | −24.45 |
| 7.51 | −15.25 |
| 7.10 | −7.92 |
| 6.62 | −0.68 |
| 6.25 | 5.69 |
| 5.69 | 17.40 |
| 5.19 | 25.25 |
| 4.65 | 34.50 |
| 4.24 | 40.25 |
| 3.63 | 45.00 |
| 3.22 | 47.20 |
| 2.73 | 48.70 |

Referring to FIG. 1, for nominal particle sizes of 130 nm monoclinic zirconia, 180 nm monoclinic zirconia, 390 nm monoclinic zirconia, and 327 nm tetragonal yttria stabilized zirconia, the zeta potential plots are similar, but not identical. Zirconia particles having a 130 nm nominal particle size have no more than a 10 mV zeta potential difference for pH ranging from approximately 9.5 to approximately 11.6. Thus, the 130 nm nominal particle size can be used for a slurry having a stable zeta potential starting at a pH of approximately 9.5. Additionally, the isoelectric point was determined to be approximately 6.6 pH.

TABLE 2

180 nm Nominal Particle Size Zirconia

| pH | Avg. Zeta (mV) |
|---|---|
| 11.60 | −51.80 |
| 11.30 | −48.40 |
| 10.70 | −47.35 |
| 10.10 | −45.90 |
| 9.72 | −42.55 |
| 9.11 | −37.85 |
| 8.51 | −32.20 |
| 7.83 | −24.75 |
| 7.33 | −16.30 |
| 6.98 | −10.35 |
| 6.62 | −4.39 |
| 6.28 | 3.14 |
| 5.75 | 16.90 |

TABLE 2-continued 180 nm Nominal Particle Size Zirconia

| pH | Avg. Zeta (mV) |
|---|---|
| 5.25 | 27.10 |
| 4.67 | 39.30 |
| 4.18 | 46.40 |
| 3.66 | 49.40 |
| 3.15 | 50.75 |
| 2.67 | 53.55 |

Zirconia particles having a 180 nm nominal particle size have no more than a 10 mV zeta potential difference for pH from approximately 8.8 to approximately 11.5. Thus, the 180 nm nominal particle size can be used for a slurry having a stable zeta potential starting at a pH of approximately 8.8. Additionally, the isoelectric point was determined to be approximately 6.4 pH.

TABLE 3

390 nm Nominal Particle Size Zirconia

| pH | Avg. Zeta (mV) |
|---|---|
| 11.30 | −48.20 |
| 11.20 | −46.10 |
| 10.70 | −45.57 |
| 10.10 | −44.00 |
| 9.75 | −44.03 |
| 9.12 | −41.03 |
| 8.61 | −37.97 |
| 7.82 | −32.60 |
| 7.43 | −27.13 |
| 7.00 | −19.83 |
| 6.59 | −11.90 |
| 6.12 | −1.87 |
| 5.68 | 9.14 |
| 5.07 | 22.83 |
| 4.67 | 33.10 |
| 3.96 | 48.87 |
| 3.66 | 54.85 |

Zirconia particles having a 390 nm nominal particle size have no more than a 10 mV zeta potential difference for pH from approximately 8.5 to approximately 11.3. Thus, the 390 nm nominal particle size can be used for a slurry having a stable zeta potential starting at a pH of approximately 8.5. Additionally, the isoelectric point was determined to be approximately 6.0 pH.

TABLE 4

327 nm Nominal Particle Size Stabilized Zirconia

| pH | Avg. Zeta (mV) |
|---|---|
| 11.50 | −30.20 |
| 11.10 | −29.00 |
| 10.70 | −27.35 |
| 10.20 | −25.20 |
| 9.58 | −21.40 |
| 9.21 | −17.95 |
| 8.72 | −12.10 |
| 8.13 | −4.99 |
| 7.40 | 6.21 |
| 6.93 | 11.25 |
| 6.55 | 15.75 |
| 6.24 | 21.10 |
| 5.78 | 26.75 |
| 5.27 | 33.30 |
| 4.68 | 40.55 |
| 4.26 | 45.75 |
| 3.67 | 46.45 |

TABLE 4-continued 327 nm Nominal Particle Size Stabilized Zirconia

| pH | Avg. Zeta (mV) |
|---|---|
| 3.25 | 48.90 |
| 2.62 | 52.90 |

Yttrium doped zirconia particles having a 327 nm nominal particle size have no more than a 10 mV zeta potential difference for pH from approximately 9.4 to approximately 11.5. Thus, the 327 nm nominal particle size can be used for a slurry having a stable zeta potential starting at a pH of approximately 9.45. Additionally, the isoelectric point was determined to be approximately 7.8 pH. In an embodiment, the zirconia particles can have a stable zeta potential starting at the pH of at least approximately 8.0, at least approximately 8.25, at least approximately 8.5, at least approximately 8.75, at least approximately 9.0, at least approximately 9.25, or at least approximately 9.5. In another embodiment, the zirconia particles can have a stable zeta potential no greater than approximately 12.0, no greater than approximately 11.75, no greater than approximately 11.5, no greater than approximately 11.25, or no greater than approximately 11.0. In a particular embodiment, the polishing slurry can have a stable zeta potential in a range of approximately 8.5 to approximately 11.6.

The iso-electric point of the zirconia particles is characterized by a pH where the zeta potential is zero. Zirconia has been reported to have an iso-electric point at a pH of 5 to 6. The data above indicate that the iso-electric point can be affected by the method of preparation. The iso-electric point may be at a pH greater than 6.0 for the 130 nm nominal size monoclinic zirconia, 180 nm nominal size monoclinic zirconia, 380 nominal size monoclinic zirconia, and the 327 nm nominal size tetragonal yttria stabilized zirconia particles. However, the iso-electric point is generally not greater than 6.75 pH for the 130 nm nominal size, 180 nm nominal size, and 380 nm nominal size monoclinic zirconia. On the other hand, the 327 nm nominal size tetragonal yttria stabilized zirconia particles can have an iso-electric point that may be at a pH greater than 7.0, or even greater than 7.5, but is generally less than 8.2 pH. In an embodiment, the iso-electric point can be characterized by a pH of at least 6.3, at least approximately 6.4, or at least approximately 6.5. In another embodiment, the iso-electric point of the zirconia particles is characterized by a pH no greater than approximately 8.5, no greater than approximately 8.25, or no greater than approximately 8.0. In a particular embodiment, the iso-electric point of the zirconia particles is characterized by a pH in a range of approximately 5.8 to approximately 6.8.

The pH of the polishing slurry with zirconia abrasives can be in a range of 1 to 14. For polishing metals, the polishing slurry may be strongly acidic to moderately basic (for example, pH from 1 to 9), and for polishing oxide materials, the polishing slurry can be moderately acidic to strongly basic (for example, pH from 5 to 14). While a variety of abrasive materials and ranges of pHs have been used for CMP, polishing may be performed such that the pH of the polishing slurry is between the iso-electric point of the material being polished and the iso-electric point of the abrasive particles. Using the polishing slurries as disclosed herein, CMP can be performed such that the iso-electric points of the material being polished and the abrasive particles are both lower or both higher than the pH of the polishing slurry. In an embodiment, the polishing slurry has a pH of at least approximately 1.0, at least approximately 3.0, or at least approximately 4.0. In another embodiment, the polishing slurry has a pH no greater than approximately 14.0, no greater than approximately 12.0, or no greater than 11.0. In a particular embodiment, the polishing slurry has a pH in a range of approximately 4.3 to approximately 10.0. In non-limiting embodiments, many of the polishing slurries described herein may be useful for polishing oxides at a pH from approximately 4.3 to approximately 12. After reading this specification, skilled artisans will be able to determine a particular pH or range of pHs for a specific polishing application.

With respect to the abrasives content within the polishing slurry, if the abrasives content is too low, the polishing rate may be too low, and if the abrasives content is too high, an unnecessary amount of abrasive material is being consumed, and scratching or other surface defects could be an issue. In an embodiment, the polishing slurry can include at least approximately 0.2 wt % zirconia particles, in another embodiment, at least approximately 0.3 wt % zirconia particles, and in still another embodiment, at least approximately 0.5 wt % zirconia particles. In a further embodiment, the polishing slurry can include no greater than approximately 20 wt % zirconia particles, in another further embodiment, no greater than approximately 9 wt % zirconia particles, and in still a further embodiment, no greater than approximately 5 wt % zirconia particles. In a particular embodiment, the polishing slurry has a range of approximately 0.5 wt % to approximately 1.5 wt % zirconia particles.

In an embodiment, the zirconia particles as described herein can be the sole abrasive material within the polishing slurry. In another embodiment, abrasive particles having another composition may be used with the zirconia particles or may replace only part, but not all, of the zirconia particles. Such other abrasive particles can include silica, alumina, ceria, titania, another ceramic material, or any combination thereof.

The polishing slurry can include another component. The polishing slurry can include a liquid medium. In an embodiment, the liquid medium can include water, an alcohol, a glycol, or any combination thereof. The polishing slurry can include an additive. The particular additive or combination of additives selected may depend on the particular material that is being polished. The additive can include a hydrolyzing agent, an oxidizer, a surfactant, a dispersing agent, a corrosion inhibitor, an acid or a base, a pH buffer, a deforming agent, a biocide, or any combination thereof. The polishing slurry may include a single additive, a combination of additives, or no additive. Any particular additive may serve a single purpose or a combination of purposes. For example, an acid can be used as an oxidizer and to adjust the pH of the polishing slurry. In a particular embodiment, the polishing slurry may not include a hydrolyzing agent, an oxidizer, a surfactant, a dispersing agent, a corrosion inhibitor, an acid or a base, a pH buffer, a deforming agent, a biocide, or any combination thereof.

The polishing slurries described herein are particularly useful for polishing silicon oxides, and more particularly $SiO_2$-containing surfaces. Thus, the polishing slurries can be used to polish glass, optics, glass hard disks, silicon oxide-containing layers in the microelectronics industry, and in other different applications. FIGS. 2 to 6 include a description of particular uses of the polishing slurries that include zirconia particles. Such uses are exemplary and do not limit the scope of the present invention. After polishing a layer using any of the polishing slurries including zirconia particles as described herein, the layer may have a surface roughness no greater than approximately 0.55 nm, no greater than approximately 0.50 nm, or no greater than approximately 0.45 nm. In a particular embodiment, surface roughness of the polished layer is in a range of approximately 0.20 nm to approximately 0.42 nm.

Figure 2:
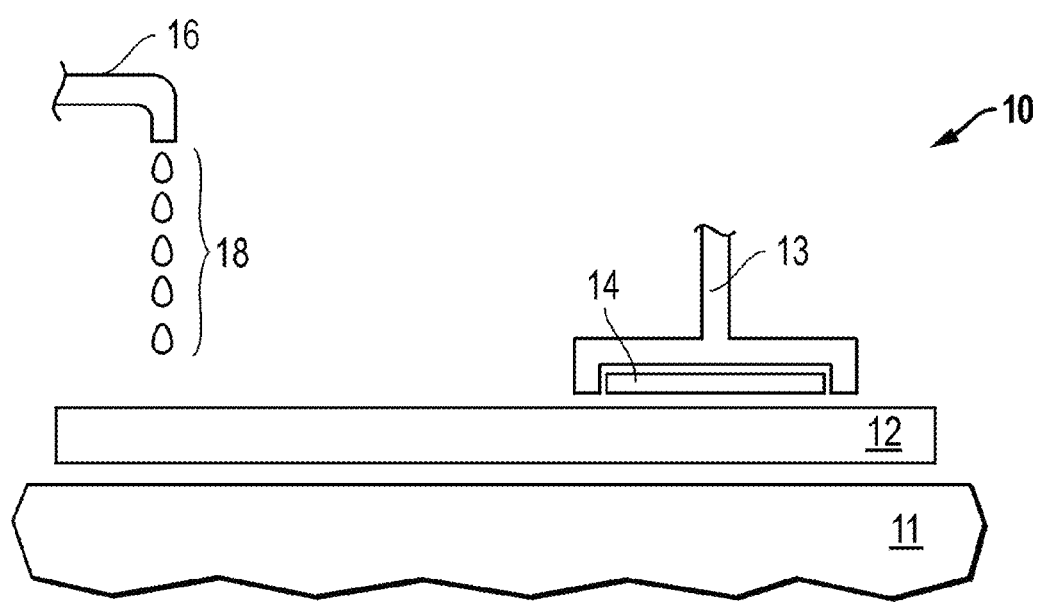
FIG. 2 includes a depiction of a polishing apparatus in accordance with an embodiment of the present invention.

FIG. 2 illustrates a depiction of a portion of a polishing apparatus 10. In an embodiment, the polishing apparatus 10 can be used to CMP a target member 14. The polishing apparatus 10 includes a platen 11 and a polishing pad 12 attached to the platen 11. During polishing, a polishing slurry 18 is dispensed from a nozzle 16 onto the polishing pad 12. The polishing slurry 18 can be any one of the polishing slurries as previously herein. The polishing slurry 18 may be dispensed at a rate of approximately 20 mL/minute to approximately 900 mL/minute.

The target member 14 is held by a substrate carrier 13 and pressed against the polishing pad 12 by the substrate carrier 13. Backside pressure in a range of approximately 1 kPa (approximately 0.14 $lbf/in^2$ ("psi")) to approximately 10 kPa (approximately 1.4 psi) may be applied by the substrate carrier 13 to the target member 14, and a downforce pressure of approximately 5 kPa (approximately 0.6 psi) to approximately 70 kPa (approximately 10 psi) can be used. In an embodiment, both the platen 11 and substrate carrier 13 rotate, which in turn, cause the polishing pad 12 and target member 14 to likewise rotate. Each of the platen 11 and substrate carrier 13 can rotate at 1 to 99 revolutions per minute ("rpm"). In an embodiment, the platen rotates at a higher rate than the substrate carrier 13. The substrate carrier 13 may also oscillate or move in another direction to reduce the likelihood of forming a pattern, such as a swirl or the like, on the polished surface of the target member 14. The actual parameters used will depend on factors including the material being polished, a limit of an external pressure gradient that the target member 14 can withstand, selectivity to an underlying material (if applicable), the composition of the polishing pad 12, the composition of the polishing slurry 18, another suitable condition, or any combination thereof.

Figure 3:
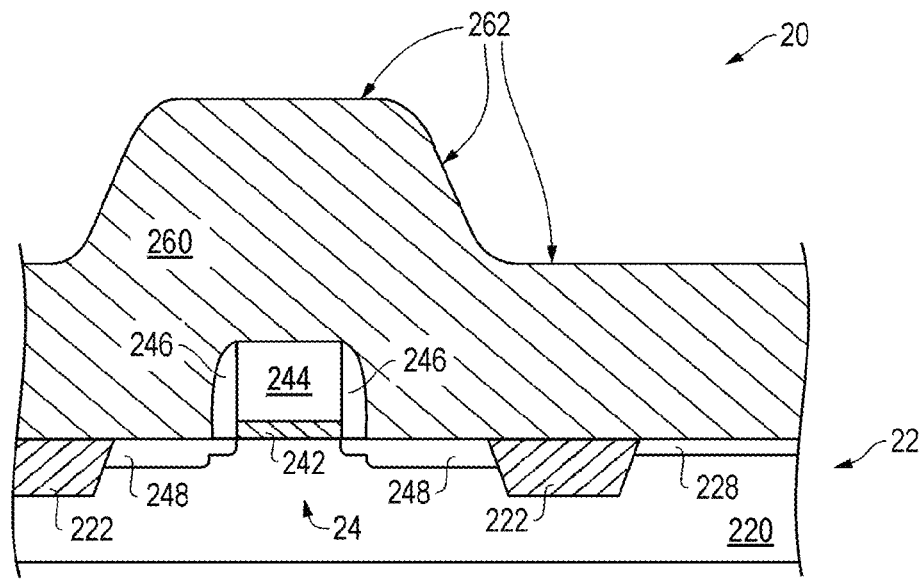
FIG. 3 includes an illustration of a cross-sectional view of a portion of a target member including a layer of an insulating material overlying a substrate and an electronic component.

FIGS. 3 to 6 include illustrations of cross-sectional views of a target member during a process sequence in which polishing is used to planarize a layer and to remove portions of a different layer to form an inlaid pattern. FIG. 3 includes an illustration of a target member 20 that includes a workpiece 22. The workpiece 22 includes a semiconductor substrate 220, which may be in the form of a monocrystalline semiconductor wafer, a semiconductor-on-insulator wafer, or another suitable form. Field isolation regions 222 are formed within the semiconductor substrate 220. The semiconductor substrate 220 further includes an electronic component, such as a transistor 24, as illustrated in FIG. 3. A gate stack, including a gate dielectric layer 242 and a gate electrode layer 244, are formed over the semiconductor substrate 220. Sidewall spacers 246 are formed along sides of the gate stack. Source/drain regions 248 are formed within the semiconductor substrate 220. Extension or lightly-doped drain portions of the source/drain regions 248 may be formed before forming the sidewall spacers 246, and relatively heavier doped portions of the source/drain regions 248 may be formed after forming the sidewall spacers 246. A substrate contact region 228 is formed within the semiconductor substrate 220 to allow an ohmic contact to be subsequently made to the semiconductor substrate 220. In a particular embodiment as illustrated in FIG. 3, the semiconductor substrate 220 and the substrate contact region 228 have a conductivity type opposite that of the source/drain regions 248.

An interlevel dielectric layer 260 is formed over the workpiece 22. The interlevel dielectric ("ILD") layer 260 is an insulating layer that can include a single film of an insulating material or a combination of films including at least two different insulating materials. When the ILD layer 260 includes a combination of films, a particular film can include an etch-stop film, a polish-stop film, an antireflective film, a bulk insulating film, or the like. Any film within the ILD layer 260 can include an oxide, an oxynitride, or a nitride. In an embodiment, the oxide can be a silicon oxide, or more particularly $SiO_2$, the oxynitride can be a silicon oxynitride, and the nitride can be a silicon nitride, or more particularly $Si_3N_4$. Another insulating material having a dielectric constant lower than $SiO_2$ may be used. For example, a fluorinated silicon oxide or a carbon-doped silicon oxide may be used.

The ILD layer 260 is formed by depositing the single film or combination of films. In the embodiment illustrated in FIG. 2, the gate stack, including the gate dielectric layer 242 and gate electrode 244, is a feature of the workpiece 20, wherein the feature overlies the substrate 220. ILD layer 260 has an uppermost surface 262 that has a topology corresponding to the exposed surface of the workpiece 22 before the ILD layer 260 was deposited. Thus, the uppermost surface 262 includes substantially horizontal surfaces and sloping surfaces between the horizontal surfaces. The ILD layer 260 may be planarized before the target member 20 is further processed.

Figure 4:
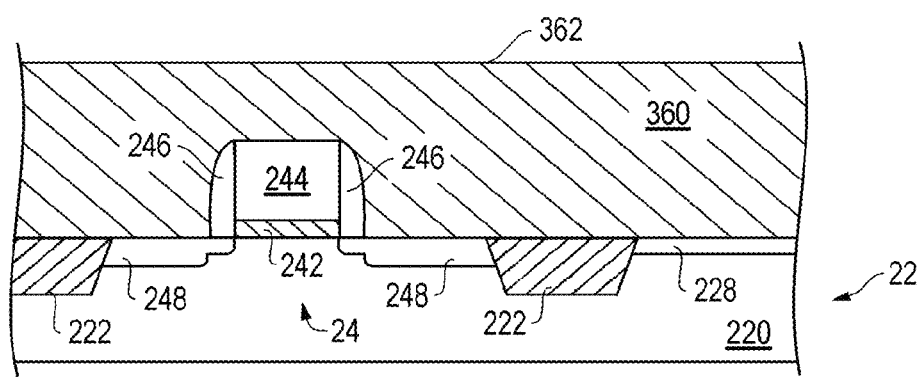
FIG. 4 includes an illustration of a cross-sectional view of the target member of FIG. 3 after planarizing the layer.

The target member 20 is placed into the polishing apparatus 10 as previously described. Because the ILD layer 260 includes an insulating material, the polishing slurry can be any of those previously described, as tailored for polishing an insulating material. In an embodiment, the polishing slurry can be an oxide polishing slurry or an oxynitride polishing material. In a particular embodiment, polishing slurry is adapted to polish a $SiO_2$-containing material. The target member is polished to remove a portion of the ILD layer to form a planarized ILD 360 having a substantially planar surface 362, as illustrated in FIG. 4.

Figure 5:
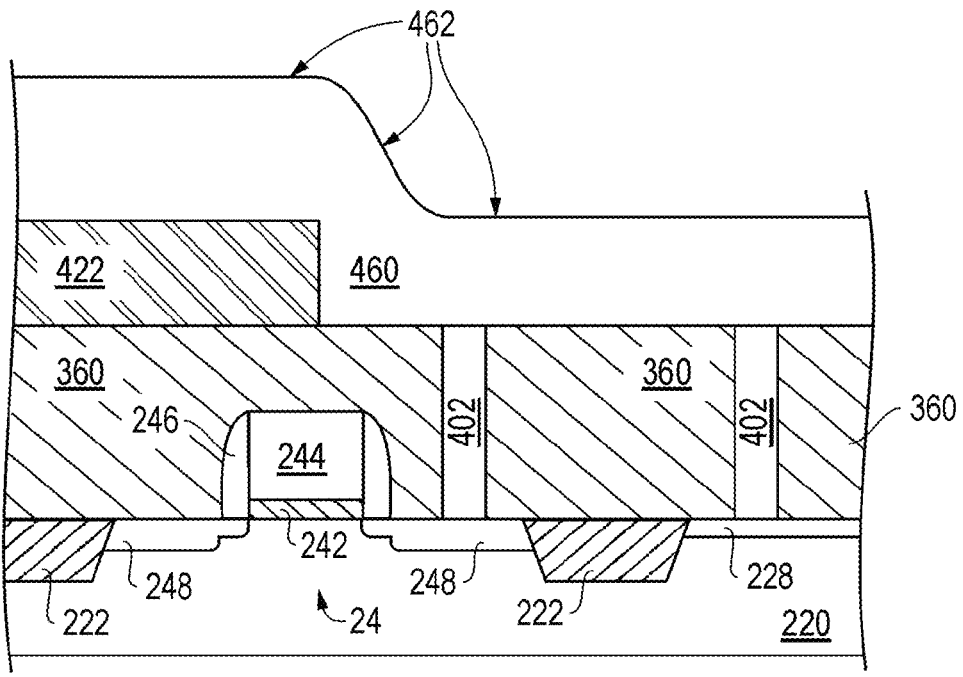
FIG. 5 includes an illustration of a cross-sectional view of the target member of FIG. 4 after forming a patterned insulating layer and a layer of a conductive material.

The target member is further processed as illustrated in FIG. 5. The ILD layer 360 is patterned to form contact openings that are filled with the conductive plugs 402. An insulating layer is deposited over the planarized ILD 360 and conductive plugs 402. The insulating layer is patterned to form a patterned insulating layer 422. The patterned insulating layer 422 defines an opening that is an interconnect trench in which an interconnect will be subsequently formed. A conductive layer 460 is formed over the patterned insulating layer 422, conductive plugs 402, and the planarized ILD layer 360. Similar to the ILD layer 260, the conductive layer 460 can include a single film or a combination of films. A film within the combination of films can include an adhesion film, a barrier film, a seed film, a bulk plated conductive film, or any combination thereof. The conductive layer 460 can include a metal-containing material and can be principally a refractory metal (that is, a metal having a melting point of at least 1400° C.), Cu, Al, a noble metal, or an alloy thereof.

The conductive layer 460 has an uppermost surface 462 that has a topology corresponding to the exposed surface of the workpiece before the conductive layer 460 was formed. Thus, uppermost surface 462 includes substantially horizontal surfaces and sloping surfaces between the horizontal surfaces. The conductive layer 460 is to be polished so that substantially all of the conductive layer 460 overlying the patterned insulating layer 422 is removed to form an interconnect.

Figure 6:
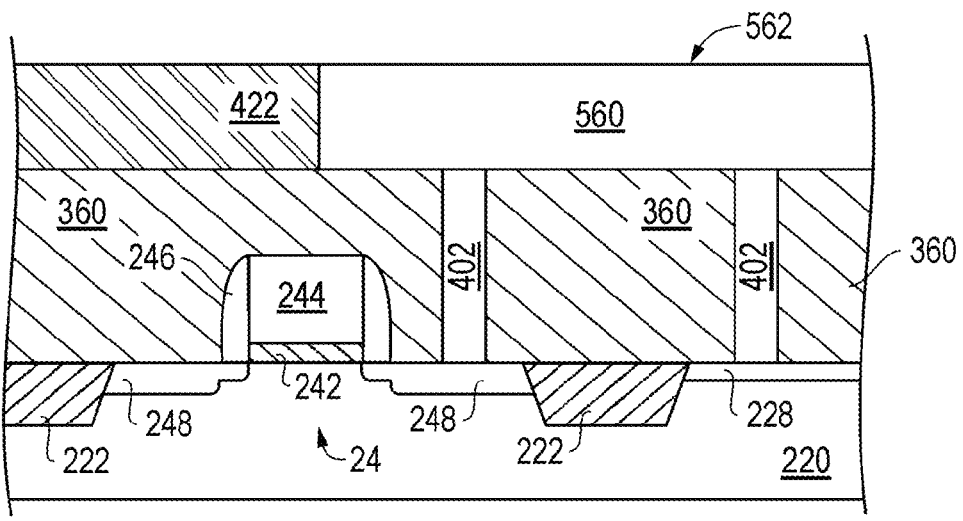
FIG. 6 includes an illustration of a cross-sectional view of the target member of FIG. 5 after removing a portion of the layer of the conductive material overlying the patterned insulating layer.

The target member is placed into the polishing apparatus 10 as previously described. Because the conductive layer 460 includes a conductive material, the polishing slurry can be any of those previously described, as tailored for polishing a conductive material. The target member is polished to remove a portion of the conductive layer to form an interconnect 560 having a substantially planar surface 562, as illustrated in FIG. 6. The substrate contact region 228 and the source/drain region 248 on the opposite side of the field isolation region 222 are electrically connected to each other. The interconnect 560 can be coupled to a signal line or to a rail that is maintained at a substantially constant voltage. In a particular embodiment, the interconnect 560 is electrically connected to a $V_{SS}$ or a $V_{DD}$ terminal.

An additional interconnect level can be formed if needed or desired. A passivation layer can be formed and patterned to expose contact pads to make a substantially complete electronic device.

Polishing can be used for other features illustrated in FIG. 6. For example, the field isolation regions 222 and the conductive plugs 402 can be formed in part using a CMP process using polishing slurries as described herein.

EXAMPLES

The concepts described herein will be further described in the following examples, which do not limit the scope of the invention described in the claims. Some of the parameters below have been approximated for convenience. For convenience, except as explicitly noted in the examples, particle sizes refer to nominal particle sizes.

Zirconia Particle Preparation

Example 1

130 nm Zirconia 500 g of zirconium oxychloride, $ZrOCl_2*8H_2O$, was treated with sodium sulfate to form zirconium basic sulfate (ZBS). The zirconium basic sulfate was then titrated with caustic soda to precipitate $Zr(OH)_4$. The $Zr(OH)_4$ is dried and calcined at 1050° C. for 4 hours in air to form an aggregated mass of monoclinic zirconium oxide crystals. The aggregated mass of zirconium oxide crystals was de-aggregated in an attrition mill using yttria stabilized zirconia as the attrition mill media. The produced monoclinic zirconia powder was estimated to have a primary particle size between 50 nm and 110 nm. The secondary particle size was 130 nm. The particles had a density of 5.58 g/cm3, a specific surface area of 23 m2/g, and an average pore size of 24.1 nm.

Example 2

180 nm Zirconia 500 g of zirconium oxychloride ($ZrOCl_2*8H_2O$) was calcined at 1000° C. for 4 hours in air to produce a mass of aggregated monoclinic zirconium oxide crystals. The aggregated mass of zirconium oxide crystals was de-aggregated in an attrition mill with yttria stabilized zirconia as the attrition mill media to produce a zirconia powder. The primary particle size was estimated to be between 70 and 120 nm. The secondary particle size of was 180 nm. The produced material had a density of 5.72 g/cm$^3$, a specific surface area of 14 m$^2$/g, and an average pore size of 25.3 nm.

Example 3

390 nm, 550 nm, 770 nm, 820 nm, 1200 nm, and 3400 nm Zirconia

Zircon sand was dissociated in an electric arc furnace at 2800° C. to form a fused zirconia aggregated powder. The fused crystals were reduced in size in an attrition mill with yttria stabilized zirconia media to produce zirconia powder having a secondary particle sizes in a range of 0.39 microns to 3.4 microns. For example, monoclinic zirconia powders having a secondary particle size of 390 nm, 550 nm, 770 nm, 820 nm, 1200 nm, and 3400 nm were obtained. The 390 nm powder had an average pore size of 18.4 nm. The 820 nm powder had a density of 5.70 g/cm$^3$, a specific surface area of 6.5 m$^2$/g, and an average pore size of 13.9 nm. The 1200 nm and 3400 nm powders had an average pore size of 18.7 nm.

Example 4

327 nm Yttrium Doped Zirconia 500 g of zirconium oxychloride (ZrOCl$_2$*8H$_2$O) was treated to form ZBS as in example 1. A yttrium salt was added to the ZBS solution in a quantity to provide 3.0 mole percent based on the final zirconia weight. The solution was precipitated to form hydrated zirconium Zr(OH)$_4$ with well dispersed yttrium. The hydrate was dried and calcined in air at 1300° C. in air for 4 hours to form an aggregated mass of doped zirconia crystals. The aggregated mass of tetragonal yttrium doped zirconium oxide crystals was de-aggregated in an attrition mill to produce a particle with a secondary particle size of 327 nm.

Silicon Wafer Polishing

Target members used in examples were prepared by thermally oxidizing 200 mm silicon wafers. The thermal oxide was polished using a Westech IPEC 372™-brand CMP polisher having a 22-inch diameter platen. The polishing pad was an IC-1000A2™-brand polishing pad available from Dow Electronic Materials. Polishing was performed using a platen rotational speed of 45 rpm, a substrate carrier rotational speed of 43 rpm, a downforce pressure of 28 kPa (4.0 psi), a backside pressure of 0.7 kPa (1.0 psi), and a slurry flow rate of 150 mL/minute. The polishing slurries were oxide polishing slurries that only included water, approximately 1 wt % of zirconia particles having sizes as described in the particular examples below, and if needed to achieve a particular pH, an acid or a base. The acid was HNO$_3$, and the base was KOH. The polishing slurry included no other component. The removal rate was calculated by measuring the oxide thickness before and after polishing. Oxide thicknesses were measured using an F20™-brand thin film analyzer available from Filmetrics, Inc. Surface metrology was performed using Zygo New View 100-brand interferometric profilometer and by atomic force microscopy. Surface appearance was inspected visually with and without the assistance of an optical microscope.

Examples 5 and 6

Examples 5 and 6 demonstrate polishing characteristics for oxide polishing slurries at different particle sizes of zirconia particles for different pH levels. Two sets of slurries were used to polish the thermal oxides grown from the wafers. Each set included particle sizes of 10 nm, 50 nm, 130 nm, 180 nm, and 820 nm. Below are data regarding attributes of the zirconia particles used.

TABLE 5

Zirconia Particle Data for Examples 5 and 6

| Particle Size (nm) | D50 (nm) | D90 (nm) | D10 (nm) | SSA (m$^2$/g) | Density (g/m$^3$) | Average Pore Size (nm) | Iso-electric Point (pH) |
|---|---|---|---|---|---|---|---|
| 10 | 10 | 10 | 5 | NA | 2.92 | 10.6 | |
| 50 | 50 | 51 | 49 | 53 | 3.20 | 3.0 | |
| 130 | 131 | 229 | 83.6 | 23 | 5.58 | 24.1 | 6.6 |
| 180 | 177 | 244 | 127 | 14 | 5.72 | 25.3 | 6.42 |
| 390 | 389.1 | 792.9 | 239.6 | | | 18.4 | 6.05 |
| 550 | 546.6 | 1119.2 | 325.7 | | | | |
| 770 | 772.2 | 1560.4 | 420.2 | | | | |
| 820 | 821.1 | 1639.7 | 432.3 | 6.5 | 5.70 | 13.9 | |
| 1200 | 1210.7 | 2239.9 | 568 | | | | |
| 3400 | 3382.5 | 9950.4 | 813.4 | | | | |

The D50, D10, and D90 values correspond to the median particle size, the 10$^{th}$ percentile particle size, and the 90$^{th}$ percentile particle size. The polishing slurries for the 10 nm and 50 nm particle sizes were in the form of colloids. Thus, the D50, D10, and D90 numbers for the 10 nm and 50 nm particles are based on vendor data. Because a meaningful SSA value for the 10 nm particle size was not obtained, an SSA value for the 10 nm particle size is not reported.

For Example 5, the polishing was performed at a pH of approximately 5. Table 5 includes data for Example 5. "Ra" is the surface roughness of the thermal oxide after polishing. "MRR" as used in the tables means material removal rate, which for the examples is the polishing rate for the thermal oxide. "SF" as used in the tables means surface finish. For the surface finish, "+" represents an acceptable surface finish, "−" represents an unacceptable surface finish, and "NA" means not applicable, because no significant amount of polishing occurred.

TABLE 6

Example 5 Polishing Data

| Particle Size (nm) | Slurry pH | Ra (nm) | MRR (nm/min.) | SF | Zeta (mV) |
|---|---|---|---|---|---|
| 10 | 5 | 0.204 | 0 | NA | |
| 50 | 5 | 0.512 | 0 | NA | |
| 130 | 5 | 0.324 | 323.7 | + | 25.25 @ pH 5.19 |
| 180 | 5 | 0.421 | 297.3 | + | 27.10 @ pH 5.25 |
| 390 | 5 | 0.19 | 250.6 | + | 22.83 @ pH 5.07 |
| 550 | 5 | 0.285 | 294.6 | + | |
| 770 | 5 | .0293 | 233.2 | + | |
| 820 | 5 | 0.821 | 229.4 | − | |
| 1200 | 5 | 0.581 | 306.3 | − | |
| 3400 | 5 | N/A | 510.4 | − | |

The polishing slurries including the 10 nm and 50 nm particle sizes did not significantly polish the thermal oxide, and therefore, MRR is reported as 0 nm/minute. For the polishing slurries at particle sizes of 130 nm and higher, acceptable polishing rates are achieved. The polishing slurries for the 130 nm, 180 nm, 390 nm, 550 nm, and 770 nm particle sizes produced an acceptable surface finish. However, the polishing slurry at a particle size of 820 nm and larger did not produce an acceptable surface finish. After polishing, Ra of the thermal oxide when using the 820 nm particle size was 0.82 nm, whereas the Ra of the thermal oxide when using the 180 particle size and smaller was no more than 0.42 nm. The SSA for the 3400 nm particle size was not available.

For Example 6, the polishing was performed at a pH of approximately 10. Table 6 includes data for Example 6.

TABLE 7

Example 6 Polishing Data

| Particle Size (nm) | Slurry pH | Ra (nm) | MRR (nm/min.) | SF | Zeta (mV) |
|---|---|---|---|---|---|
| 10 | 10 | 0.219 | 29.3 | + | |
| 50 | 10 | 0.355 | 164.8 | + | |
| 130 | 10 | 0.281 | 170.2 | + | −39.00 @ pH 10.20 |
| 180 | 10 | 0.318 | 259.4 | + | −45.90 @ pH 10.10 |
| 820 | 10 | 0.400 | 307.0 | − | |

For the polishing slurries including the 10 nm and 50 nm particle sizes, at a pH of 10, a significant amount of oxide was polished. The change in polishing rate for the polishing slurries at the smaller sizes may be related to the zeta potentials for the polishing slurries. At a low pH, the polishing slurries at 10 nm and 50 nm particles size are colloidal suspensions; however, at a pH of 10, the polishing slurries at the 10 nm and 50 nm particle sizes, the particles coagulate from the colloidal suspensions. The polishing rate for the 10 nm particle size is significantly lower than the other polishing slurries. The polishing slurries for the 10 nm, 50 nm, 130 nm and 180 nm particle sizes produced an acceptable surface finish. However, the polishing slurry at a particle size of 820 nm did not produce an acceptable surface finish.

All of the polishing slurries had a pH of approximately 5, except for the #2 Y—$ZrO_2$ Sample, which had a pH of approximately 10. All of the polishing slurries had acceptable polishing rates and provides acceptable surface finishes. Thus, ceria particles can be replaced by zirconia particles, including stabilized zirconia particles, without adversely affecting the polishing characteristics.

A few observations are made regarding the data for zirconia particles in Examples 5 to 7. A median particle size less than 821 nm may be used and achieves an acceptable surface finish. In particular, at a median particle size of 772 nm, the surface finish is acceptable. Further, when polishing oxide, significant polishing of the thermal oxide occurs when the zirconia particles have a negative zeta potential. Polishing slurries having the 50 nm and larger-sized particles provide an acceptable polishing rate. The polishing slurries having the 130 nm and larger-sized particles provide an acceptable polishing rate at a pH of 5 and 10. The observations may or may not be seen when polishing conditions are changed or when a different material is being polished. Hence, the observations are not meant to limit the scope of the present invention.

Example 8

Metal Polishing—Copper and Tantalum

The CMP polishing machine and settings were the same as described above for oxide polishing except the downforce pressure was set at 2.0 psi. The target substrate materials for removal were Cu and Tantalum.

TABLE 9

Example 8 Data

| Sample Name | D50 | D10 | D90 | Slurry pH | Cu MRR (Å/min) | Ta MRR (Å/min) | Selectivity Cu/Ta | Surface finish | Ra (Å) |
|---|---|---|---|---|---|---|---|---|---|
| Slurry 1 (1% zrO2) | 177 | 244 | 127 | 5 | 8376 | 189 | 44 | + | 11.4 |
| Slurry 2 (3% ZrO2) | 177 | 244 | 127 | 5 | 9247 | 259 | 36 | + | 14.3 |

Example 7

Yttria Doped Zirconia Particles

Example 7 demonstrates polishing characteristics for oxide polishing slurries that include approximately 1 wt % of Y-doped $ZrO_2$ (approximately 3 mol % Y) particles and ceria particles. Y-doped $ZrO_2$ particles have a tetragonal crystal form. The #1 $CeO_2$ Sample corresponds to D6720™-brand oxide polishing slurry from Cabot Microelectronics Corporation, and the #2 $CeO_2$ polishing slurry was prepared from chemically precipitated ceria made by Saint-Gobain Plastics & Ceramics, Inc. The D10 and D90 values for the #1 $CeO_2$ Sample were not available.

Both of the polishing slurries had a pH of approximately 5, had acceptable polishing rates, and provided acceptable surface finishes. Thus, zirconia particles can polish metal substrates, including Cu and Ta without adversely affecting the polishing characteristics.

Embodiments as described herein use zirconia particles within polishing slurries. The polishing slurries can provide the same or better polishing characteristics than polishing slurries including ceria particles for the same abrasives content within the polishing slurry. The zirconia particle content within the polishing slurry can be at a significantly lower content than other abrasives, such as silica and alumina. The

TABLE 8

Example 7 Data

| Sample | D50 (nm) | D90 (nm) | D10 (nm) | Isoelectric Point | pH | Ra (nm) | MRR (nm/min.) | SF | Zeta (mV) |
|---|---|---|---|---|---|---|---|---|---|
| #1 Y—$ZrO_2$ | 327 | 681 | 185 | 7.8 | 5 | 0.20 | 367.6 | + | 33.30 @ pH 5.27 |
| #2 Y—$ZrO_2$ | 327 | 681 | 185 | 7.8 | 10 | NA | 337.0 | + | −25.20 @ pH 10.20 |
| #1 $CeO_2$ | 90 | NA | NA | | 5 | | 206.1 | + | 36.5 @ pH 5.81 |
| #2 $CeO_2$ | 215 | 405 | 135 | | 5 | | 309.9 | + | −32.70 @ pH 9.93 | lower abrasives content may cause less abrasion in polishing slurry feed systems and allow plumbing and other fixtures to be used longer.

Many different aspects and embodiments are possible. Some of those aspects and embodiments are described herein. After reading this specification, skilled artisans will appreciate that those aspects and embodiments are only illustrative and do not limit the scope of the present invention. Additionally, those skilled in the art will understand that some embodiments that include analog circuits can be similarly implemented using digital circuits, and vice versa.

In a first aspect, a polishing slurry can include zirconia particles. In an embodiment, the polishing slurry can have any one or combination of the following characteristics. The zirconia particles may not include amorphous $ZrO_2$. The zirconia particles can include monoclinic $ZrO_2$, tetragonal $ZrO_2$, or cubic $ZrO_2$ particles. The zirconia particles may be characterized as having a chemical activity or an electronic activity at a surface of a material for which the polishing slurry is adapted to polish. The zirconia particles can include an element other than Zr and O that affects a crystalline structure of the zirconia particles or significantly affects a polishing characteristic of the polishing slurry. The zirconia particles can have a stable zeta potential starting at a pH of at least approximately 3.0 or no greater than approximately 9.0. The zirconia particles can have a very stable zeta potential starting at a pH of at least approximately 4.0 or no greater than approximately 9.0. The zirconia particles can have an iso-electric point characterized by a pH of at least approximately 3.0 or no greater than approximately 8.5. The polishing slurry can have a pH of at least approximately 1.0 or less than approximately 14.0. The zirconia particles can have an averaged particle size of at least approximately 50 nm or no greater than approximately 800 nm. The zirconia particles have a $10^{th}$ percentile particle size of at least approximately 51 nm or no greater than approximately 1100 nm. The zirconia particles have a $90^{th}$ percentile particle size of at least approximately 49 nm or no greater than approximately 300 nm. A majority of the zirconia particles are substantially spherical particles, substantially platelet-shaped particles, or polyhedral particles. The zirconia particles have a specific surface area of at least approximately 6 $m^2/g$ or no greater than approximately 55 $m^2/g$. The zirconia particles can have a density of at least approximately 3.0 $g/cm^3$ or no greater than approximately 5.8 $g/cm^3$. The zirconia particles can have an averaged pore size of at least approximately 1 nm or no greater than approximately 30 nm. The polishing slurry includes at least approximately 0.2 wt % zirconia particles or no greater than approximately 20 wt % zirconia particles.

In a second aspect, a method of polishing a target member can including providing the target member having a workpiece including a feature and a layer overlying the feature. The method can further include polishing the layer using a polishing slurry that includes zirconia particles. The polishing can be performed using any of the polishing slurries as described with respect to the first aspect.

In an embodiment of the second aspect, the workpiece includes an electronic component. In a particular embodiment, the layer includes an insulating material. In a more particular embodiment, the insulating material includes an oxide. In another particular embodiment, the insulating material includes a silicon oxide or a silicon oxynitride. In another more particular embodiment, polishing is performed such that the removal rate is at least approximately 150 nm/minute or no greater than approximately 400 nm/minute.

In another particular embodiment of the second aspect, the layer includes a conductive material. In a more particular embodiment, the conductive material includes a refractory metal-containing material, Cu, Al, or a noble metal. In a further embodiment, polishing is performed using a polishing pad. In still a further embodiment, polishing is performed using a polishing slurry having a pH that is higher than the iso-electric point of the zirconia particles and an iso-electric point of the layer. In yet a further embodiment, after polishing the layer, the layer has a surface roughness no greater than approximately 0.55 nm, no greater than approximately 0.50 nm, or no greater than approximately 0.45 nm. In a particular embodiment, Ra is in a range of approximately 0.20 nm to approximately 0.42 nm. Ra is greater than 0.00 nm.

In a particular embodiment of any of the preceding aspects or embodiments, a majority or substantially all of the zirconia particles include monoclinic $ZrO_2$ and tetragonal $ZrO_2$ particles, a majority or substantially all of the zirconia particles include tetragonal $ZrO_2$ particles, or a majority or substantially all of the zirconia particles include cubic $ZrO_2$ particles. In a further particular embodiment of any of the preceding aspects or embodiments, the zirconia particles are characterized as having a chemical activity or an electronic activity at a surface of a material for which the polishing slurry is adapted to polish. In another particular embodiment of any of the preceding aspects or embodiments, the zirconia particles include the element other than Zr and O that significantly affects the crystalline structure of the zirconia particles or the polishing characteristic of the polishing slurry. In a more particular embodiment of any of the preceding aspects or embodiments, the element includes a rare earth element, a Group 2 element, a Group 8 element, a Group 9 element, a Group 13 element, a Group 15 element, a Group 16 element other than O, a Group 17 element, or a noble metal.

In a further particular embodiment of any of the preceding aspects or embodiments, the zirconia particles have the stable zeta potential starting at the pH of at least approximately 3.0 at least approximately 5.0, at least approximately 6.0, no greater than approximately 9.0, no greater than approximately 8.5, no greater than approximately 8.0, or in a range of approximately 6.1 to approximately 7.9. In still a further particular embodiment of any of the preceding aspects or embodiments, the zirconia particles have the very stable zeta potential starting at the pH of at least approximately 4.0 at least approximately 5.0, at least approximately 6.0, no greater than approximately 9.0, no greater than approximately 8.5, no greater than approximately 8.0, or in a range of approximately 6.1 to approximately 7.9. In yet a further particular embodiment of any of the preceding aspects or embodiments, the zirconia particles have the iso-electric point of at least approximately 3.0, at least approximately 3.1, at least approximately 3.2, no greater than approximately 8.5, no greater than approximately 5.0, no greater than 4.7, no greater than approximately 4.3, or in a range of approximately 3.2 to approximately 4.0. In a further particular embodiment of any of the preceding aspects or embodiments, the polishing slurry has the pH of at least approximately 1.0, at least approximately 3.0, at least approximately 4.0, no greater than approximately 14.0, no greater than approximately 12.0, no greater than 11.0, or in a range of approximately 4.3 to approximately 10.0.

In another particular embodiment of any of the preceding aspects or embodiments, the zirconia particles have the averaged particle size of at least approximately 50 nm, at least approximately 80 nm, at least approximately 110 nm, no greater than approximately 800 nm, no greater than approximately 500 nm, no greater than approximately 300 nm, or in a range of approximately 130 nm to approximately 200 nm. In still another particular embodiment of any of the preceding aspects or embodiments, the zirconia particles have the 10$^{th}$ percentile particle size of at least approximately 51 nm, at least approximately 65 nm, at least approximately 80 nm, no greater than approximately 1600 nm, no greater than approximately 1100 nm, no greater than approximately 600 nm, or in a range of approximately 90 nm to approximately 300 nm. In yet another particular embodiment of any of the preceding aspects or embodiments, the zirconia particles have the 90$^{th}$ percentile particle size of at least approximately 49 nm, at least approximately 60 nm, at least approximately 70 nm, no greater than approximately 420 nm, no greater than approximately 300 nm, no greater than approximately 170 nm, or in a range of approximately 80 nm to approximately 150 nm.

In a further particular embodiment of any of the preceding aspects or embodiments, the zirconia particles have the specific surface area of at least approximately 6 m$^2$/g, at least approximately 7 m$^2$/g, at least approximately 9 m$^2$/g, no greater than approximately 55 m$^2$/g, no greater than approximately 45 m$^2$/g, no greater than approximately 35 m$^2$/g, or in a range of approximately 11 m$^2$/g to approximately 25 m$^2$/g. In yet a further particular embodiment of any of the preceding aspects or embodiments, the zirconia particles have the density of at least approximately 3.20 g/cm$^3$, at least approximately 4.00 g/m$^3$, at least approximately 5.00 g/m$^3$, no greater than approximately 5.80 g/cm$^3$, no greater than approximately 5.78 g/m$^3$, no greater than approximately 5.76 g/m$^3$, or in a range of approximately 5.50 g/m$^3$ to approximately 5.75 g/m$^3$.

In another particular embodiment of any of the preceding aspects or embodiments, the zirconia particles have the averaged pore size of at least approximately 1 nm, at least approximately 3 nm, at least approximately 5 nm, at least approximately 11 nm, no greater than approximately 30 nm, no greater than approximately 29 nm, no greater than approximately 28 nm, or in a range of approximately 11 nm to approximately 26 nm. In still another particular embodiment of any of the preceding aspects or embodiments, the polishing slurry includes at least approximately 0.2 wt % zirconia particles, at least approximately 0.3 wt % zirconia particles, at least approximately 0.5 wt % zirconia particles, no greater than approximately 20 wt % zirconia particles, no greater than approximately 9 wt % zirconia particles, no greater than approximately 5 wt % zirconia particles, or in a range of approximately 0.5 wt % zirconia particles to approximately 1.5 wt % zirconia particles.

In yet a further particular embodiment of any of the preceding aspects or embodiments, the slurry further includes a liquid medium. In still a further particular embodiment of any of the preceding aspects or embodiments, the slurry further includes a hydrolyzing agent, an oxidizing agent, a surfactant, a dispersing agent, a corrosion inhibitor, an acid or a base, a pH buffer, a deforming agent, a biocide, or any combination thereof. In yet a further particular embodiment of any of the preceding aspects or embodiments, the slurry does not include a hydrolyzing agent, an oxidizer, a surfactant, a dispersing agent, a corrosion inhibitor, a pH buffer, a deforming agent, an acid or a base, a biocide, or any combination thereof. In another particular embodiment of any of the preceding aspects or embodiments, the polishing slurry further includes other abrasive particles. In a more particular embodiment of any of the preceding aspects or embodiments, the other abrasive particles include silica, alumina, ceria, titania, or any combination thereof.

In yet a further particular embodiment of any of the preceding aspects or embodiments, the slurry has an oxide polishing rate under acidic conditions (less than 7 pH) that is 1.09 to 1.9 times greater than under basic conditions (greater than 7 pH). In another particular embodiment the slurry has an oxide polishing rate under acidic conditions (less than 7 pH) that is 1.1 to 1.9 times greater than under basic conditions (greater than 7 pH). In another particular embodiment the slurry has an oxide polishing rate under acidic conditions (less than 7 pH) that is 1.11 to 1.9 times greater than under basic conditions (greater than 7 pH).

In yet a further particular embodiment of any of the preceding aspects or embodiments, the slurry has a polishing selectivity of Cu to Ta of greater than approximately 32, greater than approximately 33, greater than approximately 35. In another particular embodiment, slurry has a polishing selectivity of Cu to Ta of not less than approximately 50, not less than approximately 47, or not less than approximately 45.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A polishing slurry comprising:
   zirconia particles having a density of at least 5.5 g/cm$^3$ to not greater than 5.8 g/cm$^3$, an average particle size of at least 80 nm to no greater than 200 nm, a specific surface area of at least 11 m$^2$/g, and an isoelectric point at a pH of at least 6.4 and not greater than 8.2, the isoelectric point being measured in an aqueous solution comprising 0.01 wt % of the zirconia particles based on the total amount of the solution, wherein the polishing slurry includes at least approximately 0.2 wt % to no greater than approximately 20 wt % zirconia particles, and wherein the zirconia particles comprise monoclinic zirconia, tetragonal zirconia, cubic zirconia, or combinations thereof.

2. The polishing slurry of claim 1, wherein the specific surface area of the zirconia particles is no greater than 25 m$^2$/g.

3. The polishing slurry of claim 1, wherein a pore size of the zirconia particles is in a range of 15 nm to 26 nm.

4. The polishing slurry of claim 1, wherein the zirconia particles have an average particle size of 120 nm to 200 nm, a density of 5.5 $g/cm^3$ to 5.8 $g/cm^3$, and a specific surface area in a range of 11 $m^2/g$ to 25 $m^2/g$.

5. The polishing slurry of claim 1, where in the zirconia particles are doped with Ce, Y, or Ca and are tetragonal and/or cubic zirconia.

6. The polishing slurry of claim 5, wherein the zirconia particles have an isoelectric point at a pH greater than 7.0 and less than 8.2.

7. The polishing slurry of claim 1, further comprising ceria particles.

8. The polishing slurry of claim 1, wherein a pH of the polishing slurry is at least about 3.

9. A particulate material comprising:
zirconia particles having an average particle size in a range of at least 80 nm to no greater than 400 nm, a density of at least 5.5 $g/cm^3$, a specific surface area of at least 11 $m^2/g$, and an isoelectric point at a pH of greater than 7.0, the isoelectric point being measured in an aqueous solution comprising 0.01 wt % of the zirconia particles based on the total amount of the solution,
wherein the zirconia particles comprise tetragonal zirconia, cubic zirconia, or combinations thereof.

10. The particulate material of claim 9, where the zirconia particles are doped with Ce, Y, or Ca.

11. The particulate material of claim 9, wherein the isoelectric point is greater than 7.5 and less than 8.2.

* * * * *